United States Patent
Yoshimizu et al.

(10) Patent No.: US 6,172,860 B1
(45) Date of Patent: Jan. 9, 2001

(54) DC POWER SOURCE UNIT ALARMING BEFORE ELECTRICALLY POWERED TOOL IS OVERHEATED AND STOPPING POWER SUPPLY THEREAFTER

(75) Inventors: Chikai Yoshimizu; Hiroaki Orikasa; Takahiko Shimada; Shigeru Shinohara; Eiji Nakayama; Kazuhiko Funabashi; Atsushi Nakagawa, all of Hitachinaka (JP)

(73) Assignee: Hitachi Koki Co., LTD, Tokyo (JP)

( * ) Notice: Under 35 U.S.C. 154(b), the term of this patent shall be extended for 0 days.

(21) Appl. No.: 09/161,379

(22) Filed: Sep. 28, 1998

(30) Foreign Application Priority Data

Sep. 26, 1997 (JP) .................................................. 9-261983
Mar. 13, 1998 (JP) ................................................ 10-062937

(51) Int. Cl.$^7$ ........................................................ H02H 5/04
(52) U.S. Cl. .......................... 361/25; 361/103; 361/93.8; 340/643
(58) Field of Search ................. 361/25, 103, 93.2, 361/93.8; 340/643; 307/149, 150

(56) References Cited

U.S. PATENT DOCUMENTS

| | | | |
|---|---|---|---|
| 4,835,410 | 5/1989 | Bhagwat et al. | 307/64 |
| 4,847,513 | 7/1989 | Katz et al. | 307/149 |
| 4,945,467 | 7/1990 | Bhagwat | 363/132 |
| 5,220,478 | * 6/1993 | Innes et al. | 361/93 |
| 5,635,806 | * 6/1997 | Wissmach et al. | 318/245 |

\* cited by examiner

*Primary Examiner*—Michael J. Sherry
(74) *Attorney, Agent, or Firm*—Sughrue, Mion, Zinn, Macpeak & Seas, PLLC

(57) ABSTRACT

A DC power source unit includes a main unit that generates DC voltage, and an output cable. The output cable has one end connected to the output of the main unit and another end attached to an adapter plug. The adapter plug Is electrically connected to an electrically powered tool, such as an electrical drill. Current flowing in the tool is detected every predetermined interval and accumulated electrical quantity is computed based on the detected current flowing in the tool. Based on the accumulated electrical quantity, the temperature of the tool is predicted. When it is determined that the tool is heated up to a first critical temperature based on the accumulated electrical quantity, an alarm unit is actuated. When it is determined that the tool is further heated up to a second critical temperature, supply of current to the tool is interrupted.

12 Claims, 9 Drawing Sheets

DC POWER SOURCE UNIT ALARMING BEFORE ELECTRICALLY POWERED TOOL IS OVERHEATED AND STOPPING POWER SUPPLY THEREAFTER

BACKGROUND OF THE INVENTION

1. Field of the Invention

The present invention relates to a DC power source unit that can be used for cordless electrically powered tools.

2. Description of the Related Art

Cordless electrically powered tools, such as electrical drills, can be used any place and are easy to use because no power source cables are required. However, the use of batteries invites some disadvantages. When the charge remaining in the batteries drops to less than an allowable limit, the batteries need to be replaced or recharged. Further, because the battery voltage gradually drops as the use of the battery progresses, the tool's operation efficiency is not constant.

Figure 1:
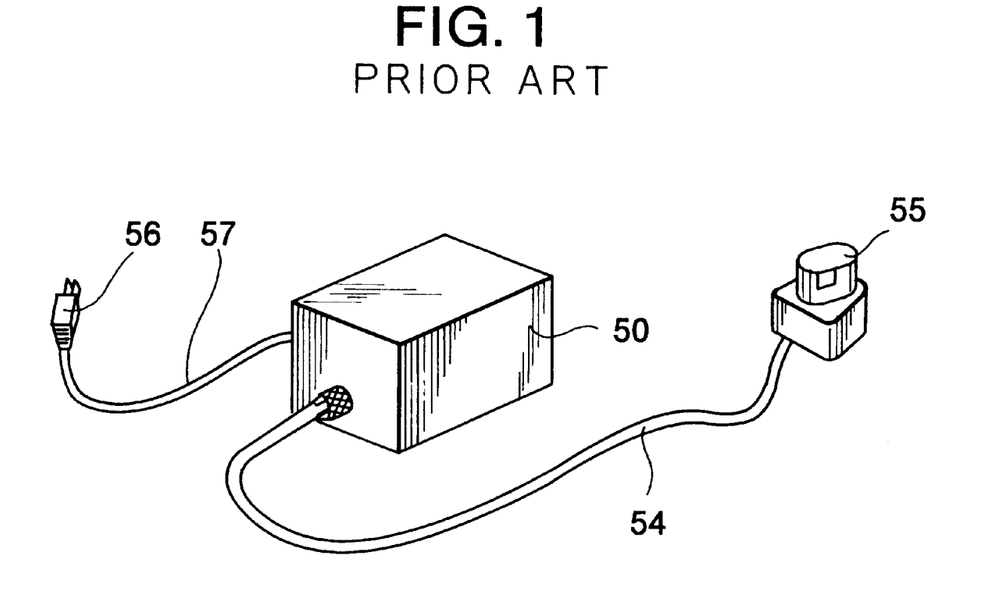
FIG. 1 is a perspective view showing a conventional DC power source unit.
Figure 2:
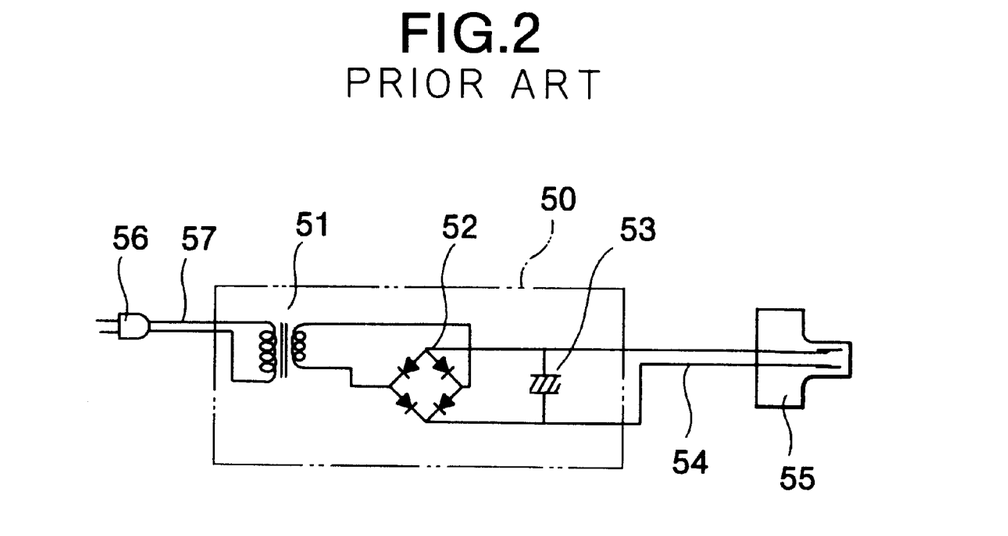
FIG. 2 is a circuit diagram of the DC power source unit shown in FIG. 1.

FIGS. 1 and 2 show a conventional DC power source unit suitable only for situations wherein the tool is used close to an AC power source and when work with the tool can be accomplished in a single location without the need to move the tool to different areas. The DC power source unit includes an AC/DC converting box 50, an input cable 57, and an output cable 54. The input cable 57 has one end connected to the converting box 50 and another end attached to a plug 56. The plug 56 is used for connection to an AC power source. The output cable 54 has one end connected to the converting box 50 and another end attached to an adapter plug 55. The adapter plug 55 is detachably connected to the electrically powered tool. As shown in FIG. 2, the converting box 50 includes a transformer 51 for dropping the AC 100 volts to ten and several volts, a rectifier 52 for rectifying the AC voltage to a DC voltage, and a smoothing capacitor 53 for smoothing the waveform of the rectified voltage.

With the DC power source unit shown in FIGS. 1 and 2, the AC voltage supplied from a commercial outlet is converted to a DC voltage to be supplied to the tool. Such a DC power source unit allows the continuous use of tools, thereby ensuring constant work efficiency.

The motors contained in electrically powered tools do not heated up significantly when the tool is driven with batteries. For this reason, the battery powered tools are, generally, not provided with motor cooling fans. Even if the fans are provided, they are small size fans.

When a tool is driven using the conventional DC power source unit, the tool tends to be used continuously for a long period of time, causing the temperature of the motor to rise significantly. This shortens the service life of the motor or the tool. To overcome the above problem, one solution would be providing a large-size cooling fan within the electrically powered tool. However, a large-size cooling fan would increase the overall size of the tool. Large size tools are not desirable for the operator to handle or operate. Another solution to this problem would be providing a temperature sensor in the tool to monitor an abnormal temperature rise within the tool. Power supply to the motor can be controlled in response to the output of the sensor. However, it is difficult to add a new component to the electrical circuitry of the tool and to modify control circuitry of the tool. Even if such addition and modification of the control circuit were made, the resultant electrical arrangement would be complicated.

SUMMARY OF THE INVENTION

In view of the foregoing, it is an object of the present invention to provide an improved DC power source unit that is suitable for use in electrically powered tools.

Another object of the present invention is to provide a DC power source unit that minimizes shortening of the service life of electrically powered tools.

To achieve the above and other objects, there are provided several types of DC power source unit for supplying DC voltage to an electrically powered tool.

According to one aspect of the present invention, the DC power source unit includes current detecting means, control means and alarm means. The current detecting means detects a current flowing in the electrically powered tool and outputs a detection signal representative of a detected current. The control means computes accumulated electrical quantity based on the detection signal received from the current detecting means.

The control means predicts that the electrically powered tool is heated up to a first critical temperature based on the accumulated electrical quantity and outputs a prediction signal representative of the first critical temperature to the alarm means. In response to the prediction signal, the alarm means indicates that the electrically powered tool is heated up to the first critical temperature. This predication is made when the accumulated electrical quantity exceeded a first predetermined quantity.

The control means stops supplying the current to the electrically powered tool when the control means predicts that the electrically powered tool is heated up to a second critical temperature higher than the first critical temperature. In this case, the control means predicts that the electrically powered tool is heated up to the second critical temperature when the accumulated electrical quantity exceeded a second predetermined quantity larger than the first predetermined quantity. A reset switch may be provided for bringing the electrically powered tool to be operable when depressed. When the control means predicts that the electrically powered tool is heated up to the second critical temperature, the control means can control the current supply to the electrically powered tool so that the tool does not become operable until the rest switch is depressed.

Alternatively, the control means can temporarily stop supplying the current to the electrically powered tool in this situation, so the current supply to the electrically powered tool is resumed after expiration of a predetermined period of rest time. When the current supplied to the electrically powered tool is temporarily stopped for a predetermined number of times within a predetermined period of time, the control means may not resume supplying the current to the electrically powered tool.

The control means may determine every predetermined interval whether or not the current detected by the current detecting means exceeds a predetermined level. The alarm means indicates that the electrically powered tool is heated up when the current exceeding the predetermined level flowed a predetermined number of times.

The current detecting means detects the current every predetermined interval, for example, every 10 msec, and the control means computes the accumulated electrical quantity based further on the predetermined interval. The control means computes the accumulated electrical quantity every predetermined interval. Specifically, the accumulated electrical quantity is computed by multiplying the current and the predetermined interval. A predetermined value may be subtracted from the computed accumulated electrical quantity.

According to another aspect of the present invention, there is provided a DC power source unit including a heat generating element connected in series to a motor contained in the tool, temperature detecting means for detecting temperature of the heat generating element, and alarm means for alarming when the temperature detected by the temperature detecting means exceeded a first predetermined temperature. The heat generating element has a temperature characteristic substantially equal to the temperature characteristic of the motor. Control means may be further provided for stopping supplying current to the electrically powered tool when the temperature detected by the temperature detecting means exceeded a second predetermined temperature higher than the first predetermined temperature. An adapter plug is electrically coupled to the tool, and the alarm means is provided in the adapter plug.

According to still another aspect of the invention, a DC power source unit includes a main unit that has an output and produces DC voltage from the output, an adapter plug that is electrically coupled to the electrically powered tool in use, a connector that is electrically connected to the output of the main unit, and an output cable having one end attached to the adapter plug and another end attached to the connector. An output voltage setting means is provided in the adapter plug for setting a level of voltage to be supplied to the electrically powered tool. The level of voltage set by the output voltage setting means corresponds to a rated voltage of the electrically powered tool. A load current detection means is also provided for detecting a load current flowing in the electrically powered tool and outputs a detection signal indicative of the load current. An output voltage changeover means is provided for changing over the level of voltage to be supplied to the electrically powered tool in response to the level of voltage set by the output voltage setting means. Specifically, the level of the voltage set by the output voltage setting means is output a control means when the detection signal indicates that no load current is flowing in the electrically powered tool. In response to the level of the voltage fed from the output voltage setting means, the control means applies a signal to the output voltage changeover means which in turn changes over the level of voltage to be supplied to the electrically powered tool. The adapter plug may be detachably connected to the one end of the output cable. Preferably, the output voltage setting means is a resistor.

BRIEF DESCRIPTION OF THE DRAWINGS

The above and other objects, features and advantages of the invention will become more apparent from reading the following description of the preferred embodiment taken in connection with the accompanying drawings in which.

DETAILED DESCRIPTION OF THE PREFERRED EMBODIMENTS

The present invention will be described with reference to preferred embodiments in which a portable electric drill is taken as an example of electrically powered tools. The electric drill, of course, should be understood as merely illustrative of the electrically powered tools, and not in any way limiting. In the following description, the same reference numerals denote the same components.

Figure 4:
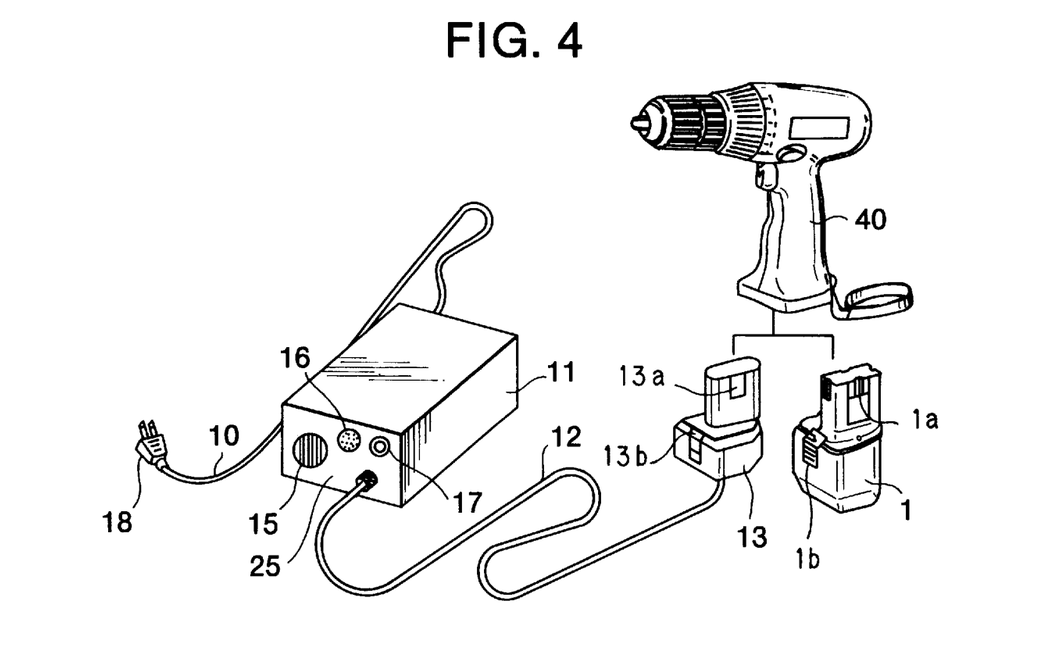
FIG. 4 is a perspective view showing the DC power source unit shown in FIG. 3 and also a portable electrical drill.

As shown in FIG. 4, a DC power source unit according to the first embodiment of the present invention includes a main unit 11, an input cable 10 and an output cable 12. The input cable 10 has one end connected to the main unit 11 and another end attached to a plug 18 to be inserted into a socket from a commercial AC 100 volt power supply. The output cable 12 has one end connected to the main unit 11 and another end attached to an adapter plug 13. The adapter plug 13 has a protruded portion that is the same shape as a battery pack 1 for use in an electrical drill 40. The adapter plug 13 as well as the battery unit 1 can be detachably mounted to the electrical drill 40. The adapter plug 13 is formed with a terminal 13a for electrical connection of the tool 40 and a latch 13b for preventing disengagement of the adapter plug 13 from the tool 40. Similarly, the battery unit 1 is formed with a terminal 1a and a latch 1b.

Figure 3:
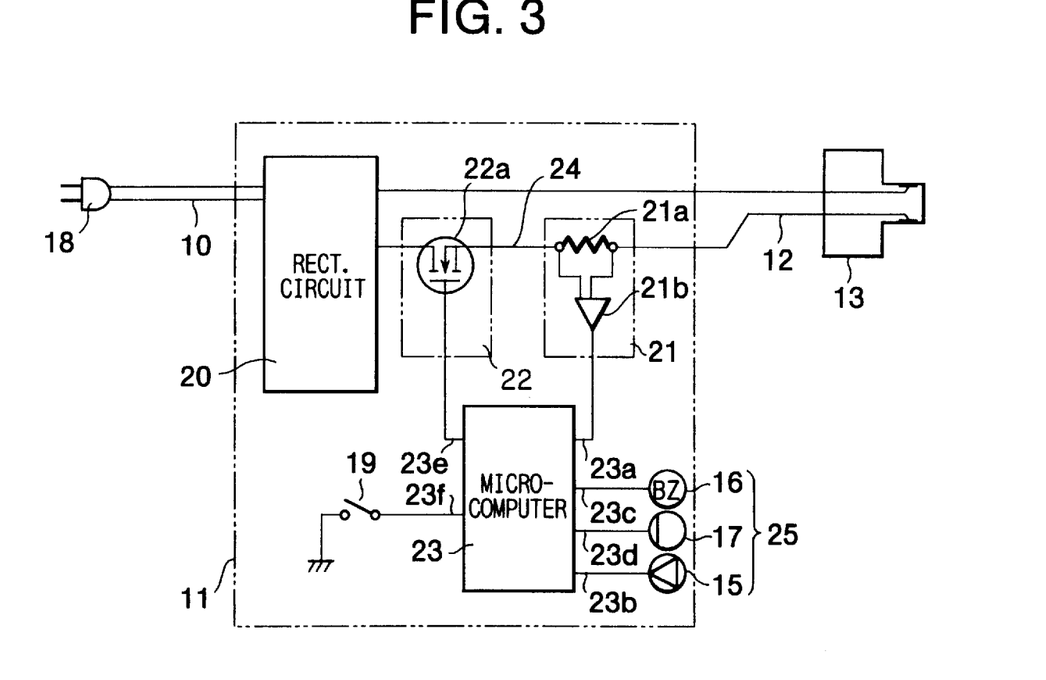
FIG. 3 is a circuit diagram of a DC power source unit according to a first embodiment of the present invention.

A first embodiment of the present invention will now be described while referring to FIGS. 3 through 6. FIG. 3 shows an electrical circuitry of the main unit 11 according to the first embodiment. As shown, the main unit 11 includes a rectifying circuit 20, a switching circuit 22, a microcomputer 23, and a detection circuit 21. The rectifying circuit 20 is connected to the commercial AC 100 volt power supply through the input cable 10 and converts an AC voltage to a DC voltage. One input of the switching circuit 22 is connected to the output of the rectifying circuit 20 and the output of the switching circuit 22 is connected to the detection circuit 21. The switching circuit 22 includes an FET 22a that is rendered OFF in response to a signal fed to the gate of the FET 22 from the output port 23e of the microcomputer 23. The detection circuit 21 includes a resistor 21a and an operational amplifier 21b that amplifies a voltage developed across the resistor 21a. The output of the operational amplifier 21b is connected to the input port 23a of the microcomputer 23. A speaker 15, a buzzer 16 and a lamp 17, which constitute an alarm section 25, are connected to the output ports 23b, 23c and 23d of the microcomputer 23, respectively. The output of the detection circuit 21 is connected to the adapter plug 13 through the output cable 12.

Operation of the DC power source unit shown in FIG. 3 will be described while referring to the flowchart shown in FIG. 5. In the following description, Si indicates the step number of the flowchart.

When the plug 18 is connected to the commercial AC power supply, the microcomputer 23 starts executing the program (S100). Upon the program being started, an initialization process is carried out (S101). The initialization process includes resetting the ports of the microcomputer 23 and an accumulated electrical quantity M and also initialization of a maximum value Mmax. The maximum value Mmax represents the maximum electrical quantity that can be consumed by the electrical drill when driven continuously. This value is determined based on the temperature of the motor of the electrical drill, which changes in relation to the electrical quantity supplied to the drill.

After the initialization process is completed, a 10 msec counter is started to count up (S102). Next, whether or not 10 msec has elapsed is determined (S103). If it is determined that 10 msec has elapsed, the program proceeds to S104 where current flowing into the electrical drill 40 is detected and subjected to A/D (analog-to-digital) conversion and a resultant current value is read. In S105, the current value detected in S104 is multiplied by 10 msec to obtain an electrical quantity ΔM supplied to the electrical drill 40 and consumed thereby during 10 msec. It should be noted that the electrical quantity ΔM is an integrated value of current with respect to time in units of Ah (Ampere hour).

Next, an updated accumulated electrical quantity M is computed by retrieving an accumulated electrical quantity M from memory and adding it to the electrical quantity ΔM (S106). Afterwards, the 10 msec counter is cleared (S107). In S108, the updated accumulated electrical quantity M is compared with 90% of the maximum value Mmax. If the accumulated electrical quantity M is less that 90% of the maximum value Mmax, i.e., M<0.9×Mmax, then the routine returns to S102. On the other hand, if the accumulated electrical quantity M is equal to or greater than 90% of the maximum value Mmax, i.e., M≧0.9×Mmax, the routine proceeds to S109 where the accumulated value M is compared with the maximum value Mmax. If the comparison results of S109 indicate that the accumulated value M is less than the maximum value Mmax, i.e., M<Mmax, then the routine proceeds to S110 where currents are supplied to the output ports 23b, 23c and 23d to turn on the alarm section 25. When the alarm section 25 turns on, then an announcement voice message is produced from the speaker 15. An example of the voice message is "The tool has overheated. Please stop the tool until it has sufficiently cooled". At the same time, the buzzer 16 generates an alarm sound and the lamp 17 is lit.

When the user continues to use the electric drill 40 under the situation where the alarm section 25 is ON (S108:Yes), it is determined whether or not the accumulated value M is equal to or greater than the maximum value Mmax (S109). If so, the FET 22a of the switching circuit 22 is rendered OFF in response to a signal output from the output port 23e of the microcomputer 23, so that the current flowing in the electrical drill 40 is interrupted (S111). Thereafter, when it is determined that the reset switch 19 is ON, the routine proceeds to S113 and then returns to S100.

As described, power supply to the electric drill 40 is interrupted before the motor temperature becomes exceedingly high even if the electrical drill 40 is continuously driven using the DC power source unit 11. As such, the service life of the motor and the electrical drill 40 will not be excessively shortened caused by overheating. Further, the alarm section 25 gives the user advance warning before interruption of the power supply to the electrical drill 40. Therefore, the user can recognize the situation and comprehend the reason why the electric drill is suddenly stopped.

Figure 8:
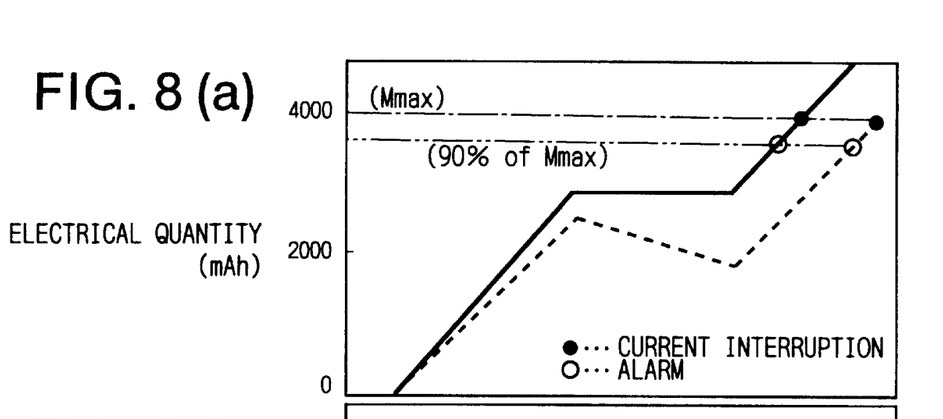
FIG. 8(a) is a graphical representation showing a relationship between time and accumulated electrical quantity stored in a memory of a microcomputer included in the DC power source unit.
FIG. 8(b) is a graphical representation showing a relationship between time versus motor temperature.
FIG. 8(c) is a graphical representation showing a relationship between time and current flowing in the electrically powered tool.

Another program for use in the first embodiment of the present invention will next be described while referring to the flowchart shown in FIG. 6. This program is prepared as an improvement of the above-described program. The following program takes into account that the motor will cool when the electrical drill 40 is not used for some time. As denoted by solid lines in FIGS. 8(a) through 8(c), in the previous program, the accumulated electrical quantity M increases while the drill is being driven. When current i of the drill is interrupted as shown in FIG. 8(c), the increase is halted so that as shown in FIG. 8(a) the accumulated electrical quantity M is maintained at a level immediately before the interruption. The M starts increasing when the current supply is resumed. However, as shown in FIG. 8(b), the heated motor naturally cools down during non-use periods of the drill. Therefore, according to the previous program, the alarm process may be implemented and the current may be forcibly interrupted even though the motor temperature has not yet actually reached an abnormally high level as indicated by a solid line in FIG. 8(a).

Figure 5:
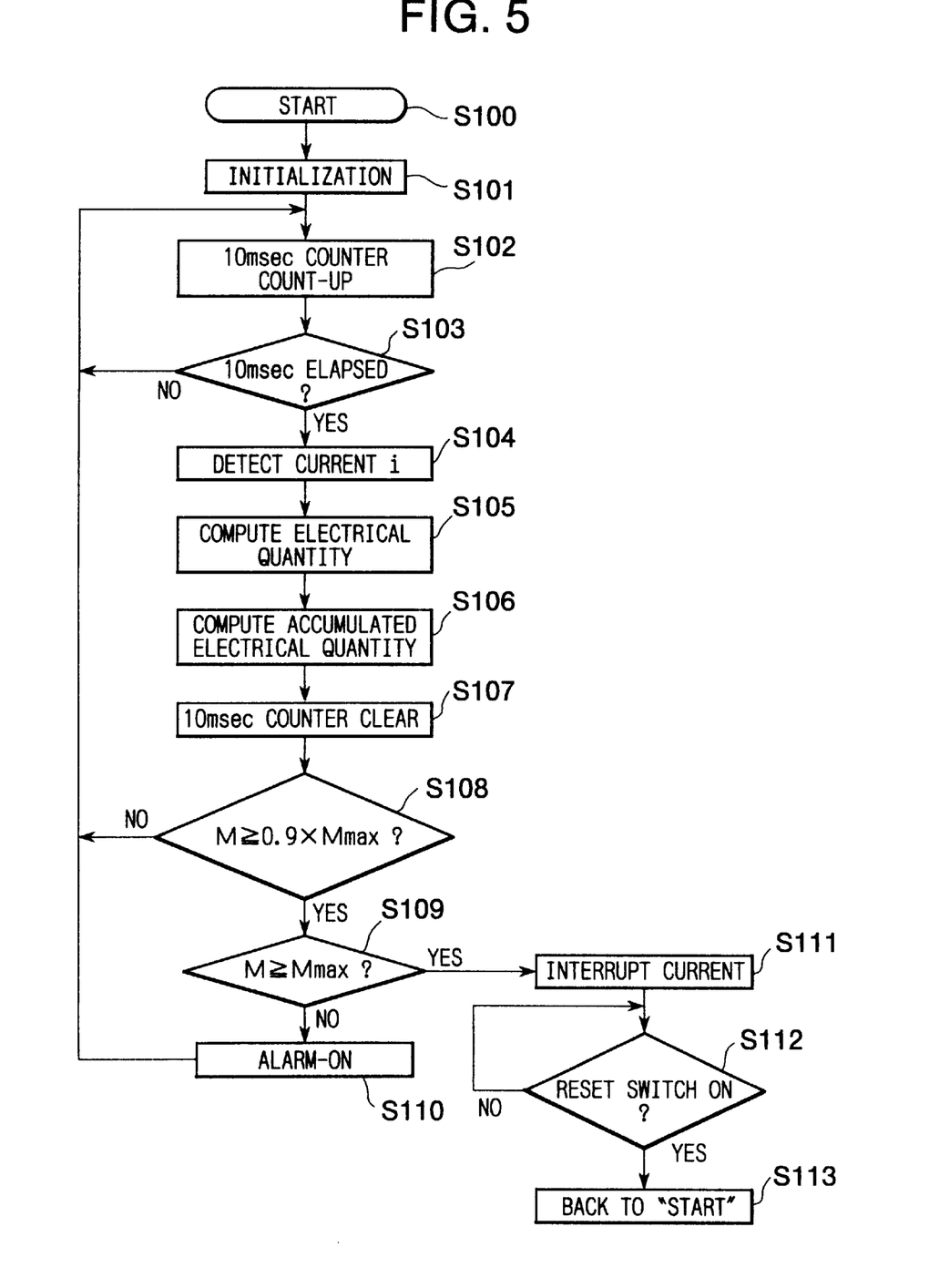
FIG. 5 is a flowchart illustrating a program for operating the DC power source unit of the first embodiment of the present invention.
Figure 6:
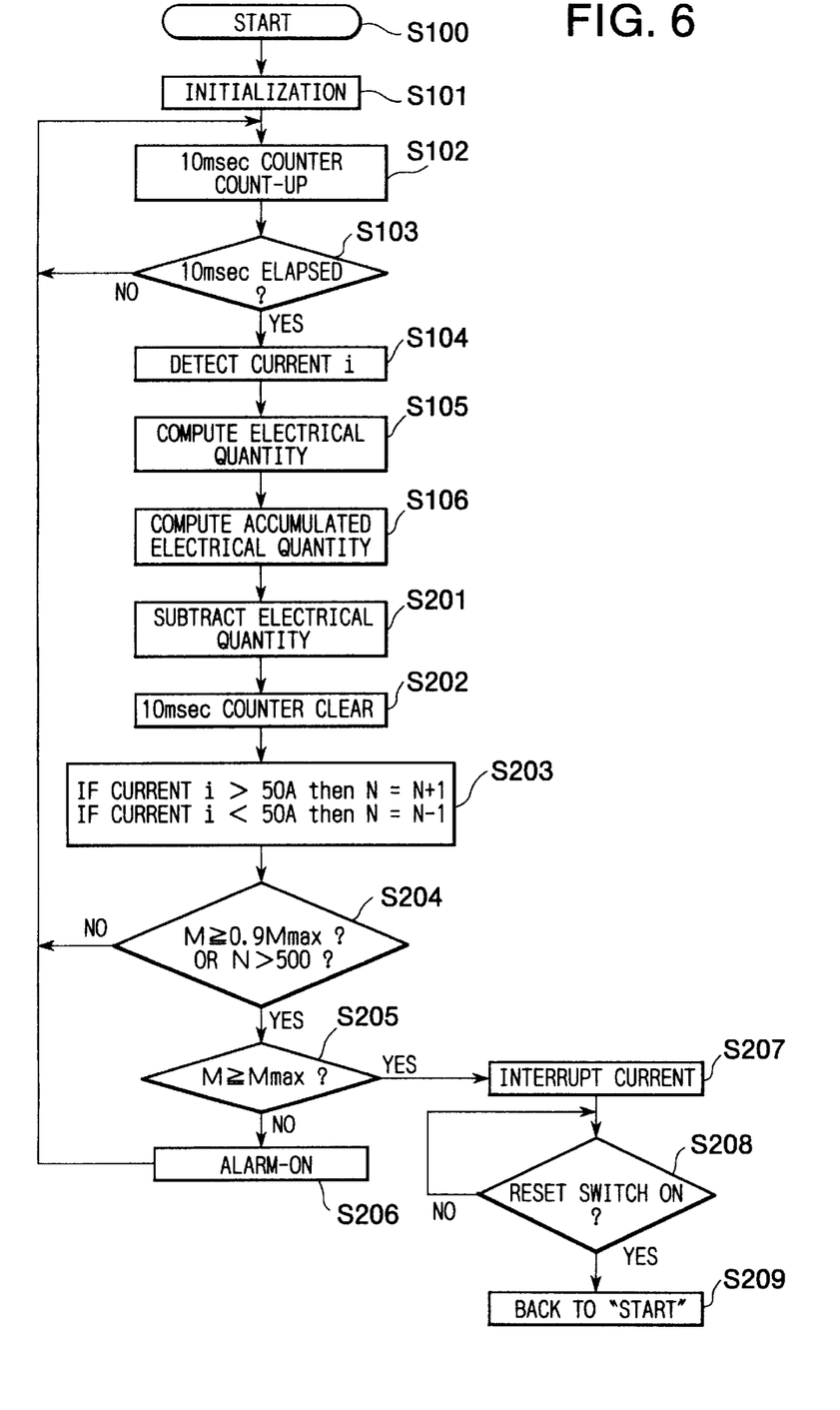
FIG. 6 is a flowchart illustrating another program for operating the DC power source unit of the first embodiment of the present invention.

In the flowchart of FIG. 6, the processes executed in S100 through S106 are identical to the same numbered steps in the flowchart of FIG. 5. Therefore, previously described steps will be omitted here. After the accumulated electrical quantity M is obtained in S106, then in S201 the electrical quantity Mh is subtracted from electrical quantity M. Subtraction of Mh is carried out every 10 msec regardless of whether the electrical drill 40 is being used or not. In this program, the value Mh is set to 0.0111 mAh. Because the value Mh is set to such a small value, the result of modified calculation of the accumulated electrical quantity M performed when the drill 40 is continuously being driven does not differ greatly from the accumulated electrical quantity calculated without performing subtraction. When the drill 40 is not used, that is, while the heated motor is naturally cooling down, the accumulated electrical quantity M gradually decreases. In this manner, the alue Mh is set to a small value relative to increasing electrical quantity when no cooling fan is provided as in this embodiment. However, if a cooling fan is provided, Mh is selected to be a value larger than the value mentioned above. With such a modified calculation of the accumulated electrical quantity, the change in the accumulated electrical quantity generally follows the change in the motor temperature as indicated by a broken line in FIG. 8(a). Therefore, optimal temperature control can be achieved.

Even if the motor temperature increases to an exceedingly high temperature because the electrical drill is used continuously for a long time, a rest time of one hour or so is sufficient for the electrical drill to naturally cool so that the heated temperature returns to a normal temperature. The value of 0.0111 mAh for the parameter Mh is selected so that the accumulated electrical quantity M is reduced from 4000 mAh to approximately 0 Ah when the non-use time continues for one hour. It should be noted that the minimum accumulated electrical quantity is zero even if the total subtract value exceeds the accumulated electrical quantity M to be subtracted by Mh.

In S203 and S204 of the flowchart in FIG. 6, the alarm section 25 is turned on when a high level current flows continuously in the electric drill 40 for some reason. This prevents the service life of the motor from being shortened by such an unexpected cause. If a high level current flows in the electrical drill 40 for about 20 seconds, the temperature of commutator, carbon brush and windings raises to an exceedingly high temperature, damaging the electrical drill. In S203, the level of the current i flowing in the motor is monitored. When the current i is greater than 50 Amp, the count number N is incremented by one whereas when the current i is less than 50 Amp, the count number N is decremented by one. In S204, it is determined whether or not the count number N is greater than 500. When the determination made in S204 indicates that the count number N is greater than 500, the routine proceeds to S205 and then to S206 where the alarm section 25 is turned on. The count number N is set so that the count number does not become less than zero. While in this example, the alarm section 25 is turned on when the count number N becomes greater than 500, power for driving the electrical drill 40 may be interrupted instead.

Operation of the DC power source unit according to the second program described above will be described while showing specific examples. In the following examples, when $\Delta M$ is equal to or less than zero, $\Delta M$ will be treated as zero. Further, the accumulated electrical quantity is assumed to be zero at the start of drilling.

EXAMPLE 1

The time duration that the electrical drill 40 can be continuously used will be calculated assuming that the drill 40 is continuously driven with a current of 20 Amp flowing therein. The calculated time duration is from the start of drilling to the interruption of power supply to the drill which occurs when the accumulated electrical quantity M exceeds the maximum value Mmax.

Electrical quantity $\Delta M$ to be added to the accumulated electrical quantity M after elapse of every 10 msec interval is determined by the following equation:

$$(I \times 10 \text{ mse}) - Mh = (20A \times 0.01 \text{ sec}/3600) - 0.0111 \text{ mAh} = 0.0444 \text{ mAh}$$

The number of times n the 10 msec counter counts during a time duration from the start of drilling to just when the accumulated electrical quantity exceeds the maximum value Mmax of 4000 mAh is obtained by the following calculation:

$$n = Mmax/\Delta M = 4000/0.0444 = 90090$$

Accordingly, the time duration is about 15 minutes (i.e., 10 msec×90090=900.9 sec≈15 min). That is, after about fifteen minutes from the start of drilling, the power supply to the drill 40 is forcibly interrupted.

EXAMPLE 2

The drill 40 is driven for 10 seconds with a current of 20 Amp flowing therein and is stopped for 20 seconds. When this drive/stop cycle is repeatedly carried out, a time duration from the start of drilling to the forcible stop of the power supply is calculated.

Electrical quantity $\Delta M1$ to be added at every 10 msec interval to the accumulated electrical quantity M during 10 seconds is determined using the following equation:

$$(20 A \times 0.01 \text{ sec}/3600) - 0.0111 \text{ mAh} = 0.0444 \text{ mAh}$$

The number of times n1 the 10 msec counter counts during 10 seconds is 1000 (=10/0.01). On the other hand, during 20 seconds stop period of time, the number of times n2 the 10 msec counter counts is 2000 (=20/0.01) and every 10 msec, electrical quantity $\Delta M2$ is added. $\Delta M2$ in this case is −0.0111 mAh.

Accordingly, electrical quantity to be added for 30 seconds is determined by the following equation:

$$\Delta M1 \times n1 + \Delta M2 \times n2 = 44.4 - 22.2 = 22.2 \text{ mAh}$$

The number of times the drive/stop cycle is performed until the accumulated electrical quantity M exceeds the maximum value Mmax is 180 (=4000/22.2). That is, the forcible stop of the drill 40 occurs after about 90 minutes (=30 sec×180) from the start of drilling.

EXAMPLE 3

The drill 40 is driven for 10 seconds with a current of 20 Amp flowing therein and is stopped for 40 seconds. When this drive/stop cycle is repeatedly carried out, a time duration from the start of drilling to the forcible stop of the power supply is calculated.

Electrical quantity $\Delta M1$ to be added at every 10 msec interval to the accumulated electrical quantity M during 10 seconds is determined using the following equation:

$$(20 A \times 0.01 \text{ sec}/3600) - 0.0111 \text{ mAh} = 0.0444 \text{ mAh}$$

The number of times n1 the 10 msec counter counts during 10 seconds is 1000 (=10/0.01). On the other hand, during 40 seconds stop period of time, the number of times n2 the 10 msec counter counts is 4000 (=40/0.01) and every 10 msec, electrical quantity $\Delta M2$ is added. $\Delta M2$ in this case is −0.0111 mAh.

Accordingly, electrical quantity to be added for 50 seconds is determined by the following equation:

$$\Delta M1 \times n1 + \Delta M2 \times n2 = 44.4 - 44.4 = 0 \text{ mAh}$$

The above calculations indicate that the electrical drill 40 is not forcibly stopped if 40 second non-use time is preserved after 10 second drilling. The motor heated up during the 10 second drilling time is naturally cooled down during the following 40 second non-use time.

EXAMPLE 4

A time duration from the start of drilling to the forcible stop of the power supply is calculated when the drill 40 is driven continuously with a current of 10 Amp.

Electrical quantity $\Delta M$ to be added at every 10 msec interval to the accumulated electrical quantity M during 10 seconds is determined using the following equation:

$$(10 A \times 0.01 \text{ sec}/3600) - 0.0111 \text{ mAh} = 0.01667 \text{ mAh}$$

The number of times n the 10 msec counter counts during an allowable continuous driving time is 239,952 (=4000/0.01667). Therefore, about 40 minutes (=10 msec×239,952≈2400 sec) after from the start of drilling, the power supply to the drill 40 is forcibly interrupted.

EXAMPLE 5

Assuming that the drill 40 is accidentally locked and 100 Amp load current continuously flows in the motor, the count number N is incremented every 10 msec. The time needed for the count number N becoming equal to or greater than 500 is 5 seconds (=500×10 msec). That is, after 5 seconds from the start of drilling, the power supply to the drill 40 is forcibly interrupted.

In the above-described embodiment, subtraction of Mh from the accumulated electrical quantity was made to take a natural cooling effect into account. However, a heat amount radiated from the motor is not fixed but varies depending upon the environmental temperature. The larger the difference between the motor temperature and the ambient temperature, the more is the amount of heat radiated from the motor. When it is considered that the amount of heat naturally radiated from the motor is proportional to α-th power of temperature of the motor, the temperature of the motor is proportional to β-th power of an accumulated electrical quantity supplied to the motor, and Mh is proportional to an amount of heat radiated from the motor, then the following relationship can be established:

$$Mh = \beta * (\alpha\text{-th power of accumulated electrical quantity M})$$

where α and β are constants determined by the configuration and material of the motor and also by how the heat radiation is performed. By storing in a memory of the microcomputer 23 the above relationship or tables prepared based on the above relationship, the parameter Mh can be varied depending upon the accumulated electrical quantity. With the use of an appropriately varying parameter Mh, the motor temperature can be more accurately predicted, resulting in an optimal control of the electric drill.

Figure 7:
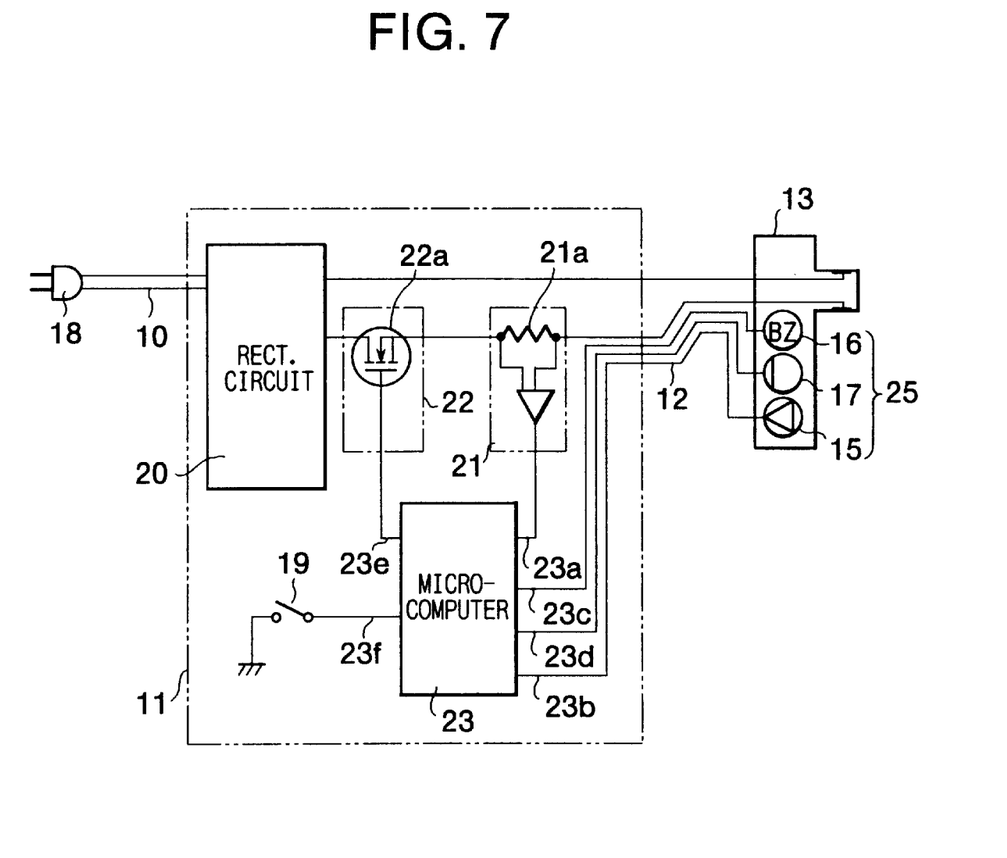
FIG. 7 is a circuit diagram of a DC power source unit according to a modification of the first embodiment of the present invention.

FIG. 7 is a modification of the arrangement shown in FIG. 3. In this modification, the alarm section 25 including the speaker 15, buzzer 16, and light 17 is provided in the adapter plug 13. By this arrangement, the user can readily recognize that the alarm section 25 is turned on.

A second embodiment of the present invention will be described while referring to FIGS. 9 and 10. The second embodiment overcomes a problem of the first embodiment such that the stored information about the accumulated electrical quantity is lost when supply of the commercial AC 100 volt power supply is interrupted or the plug 18 is disconnected from the socket. In the first embodiment, the temperature increase of the motor is predicted from the electrical quantity ΔM and the accumulated electrical quantity M is compared with the maximum value Mmax. The accumulated electrical quantity M represents the predicted current temperature of the motor. Therefore, if the accumulated electrical quantity is not available, determination as to whether or not the temperature of the motor has reached a critical condition cannot be made.

Figure 9:
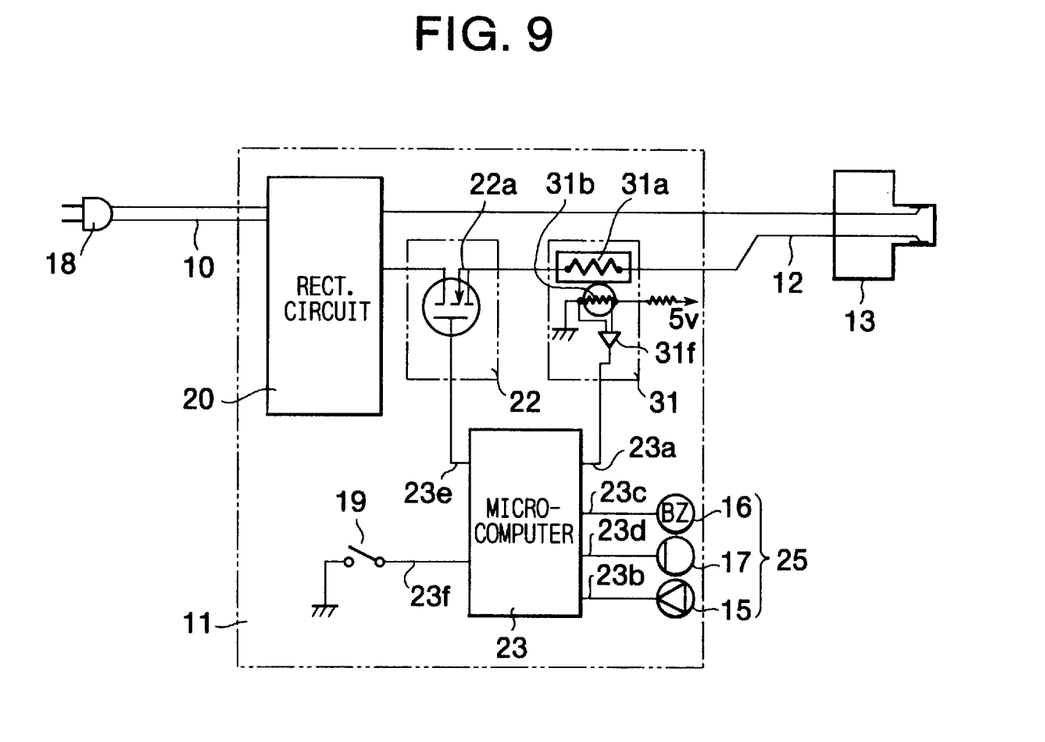
FIG. 9 is a circuit diagram of a DC power source unit according to a second embodiment of the present invention.

As shown in FIG. 9, the DC power source unit according to the second embodiment includes a temperature detection circuit 31 connected to the output of the switching circuit 22. The temperature detection circuit 31 includes a heat generating element 31a, a thermister 31b thermally coupled to the heat generating element 31a for converting the surface temperature of the heat generating element 31a to an electrical signal, an operational amplifier 31f for amplifying the electrical signal received from the thermister 31b. The resultant amplified signal is supplied to the microcomputer 23 through the input port 23a.

Figure 10:
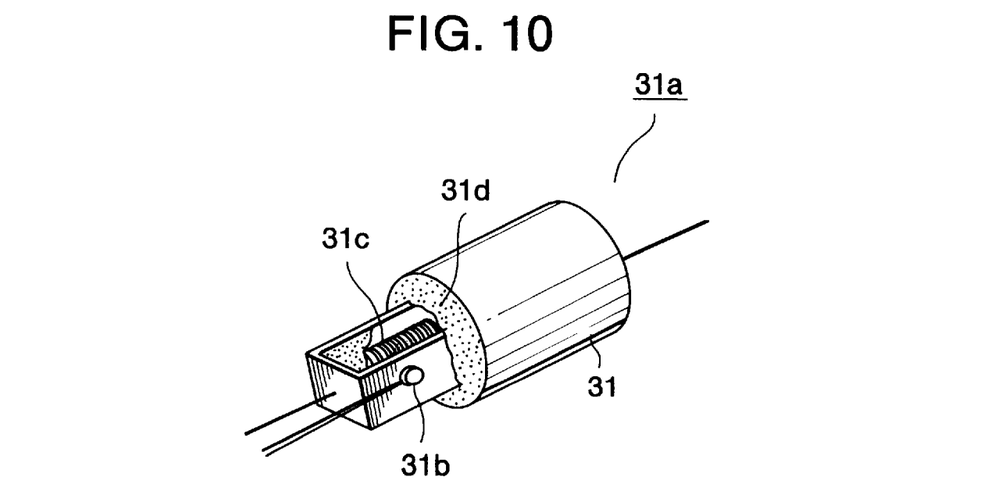
FIG. 10 is a perspective view showing a heat generating element used in the DC power source unit shown in FIG. 9 wherein a part of heat shielding material surrounding the heat generating element is cut away.

As shown in FIG. 10, the heat generating element 31a includes a ceramic member 31c sealing a resistor with ceramic material, and a heat shielding material 31d, such as a glass wool, that covers the ceramic member 31c. The thermister 31b is disposed in the heat shielding material 31d. The heat generating element 31a has a temperature characteristic approximately equal to the temperature characteristic of the motor. That is, the heat generating element 31a is heated up and cooled down corresponding to the temperature change of the motor contained in the electrical drill 40.

The temperature of the heat generating element 31a is compared with a predetermined temperature. Based on the comparison results, an alarm signal is generated and/or the supply of power to the electrical drill is interrupted. With such an arrangement, an optimal control can be accomplished should the commercial power supply be interrupted or the plug be disconnected from the power supply socket.

In the second embodiment, when the accumulated electrical quantity has become equal to or greater than the maximum value Mmax and/or the temperature of the heat generating element 31a has become a temperature equal to or higher than a predetermined temperature, power supply to the electric drill 40 is interrupted.

A modification is possible such that power supply is interrupted for a predetermined period of time. In this case, the reset switch 19 does not need to be manipulated. After expiration of the predetermined period of time, the accumulated electrical quantity is reduced so that driving of the electrical drill 40 can be resumed. With such a configuration, operation facility of the electrical drill is improved.

When the temporary stops of the drill occur a predetermined number of times within a prescribed period of time, the power supply to the drill can be interrupted. By so doing, the load imposed on the electrical drill 40 is lessened and lowering of the service life of the drill is minimized.

A third embodiment of the present invention will be described while referring to FIGS. 11 and 12. The third embodiment is directed to a DC power source unit including an output voltage setting unit that sets an output voltage applied to the electrical drill 40.

Figure 11:
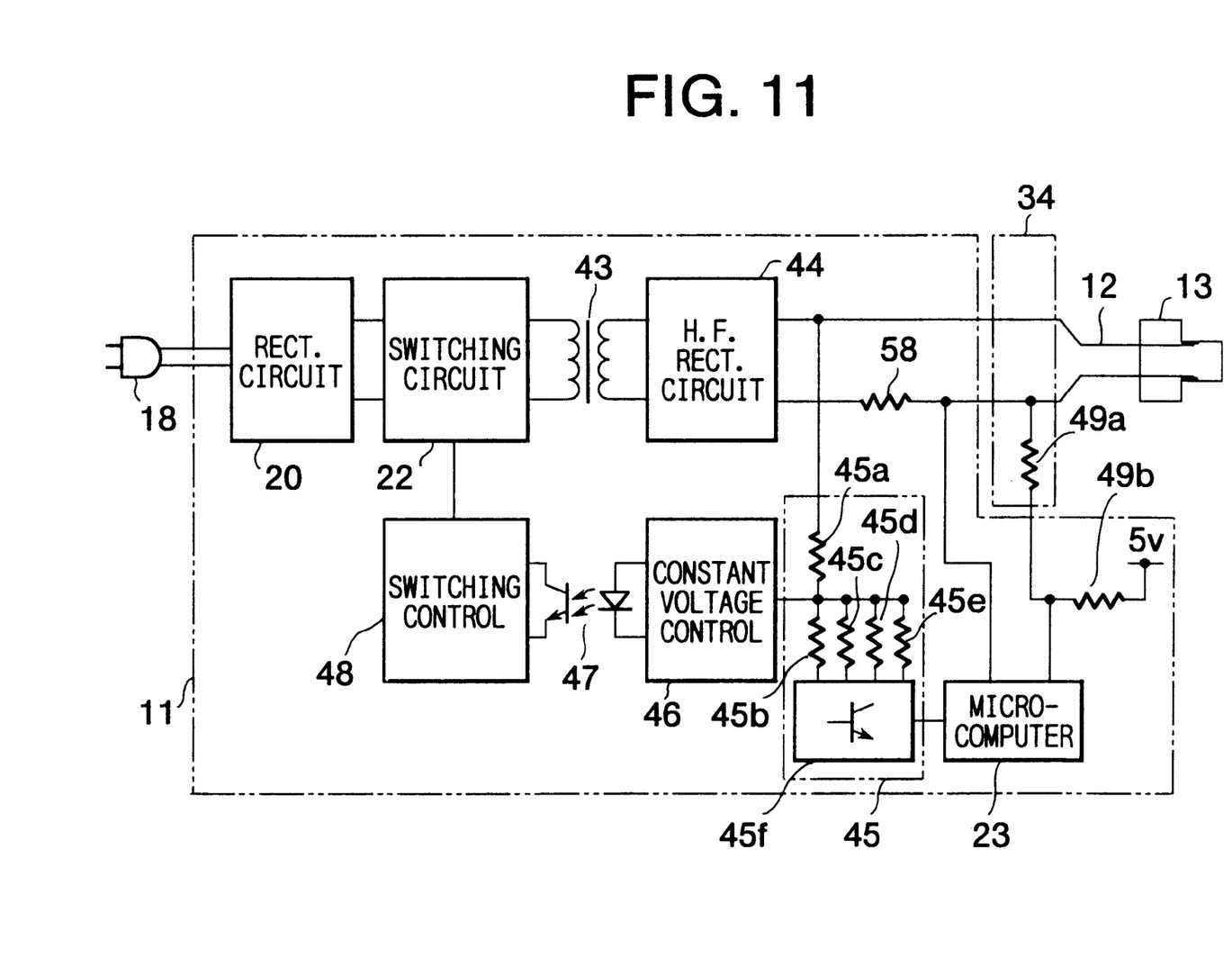
FIG. 11 is a circuit diagram of a DC power source unit according to a third embodiment of the present invention.
Figure 12:
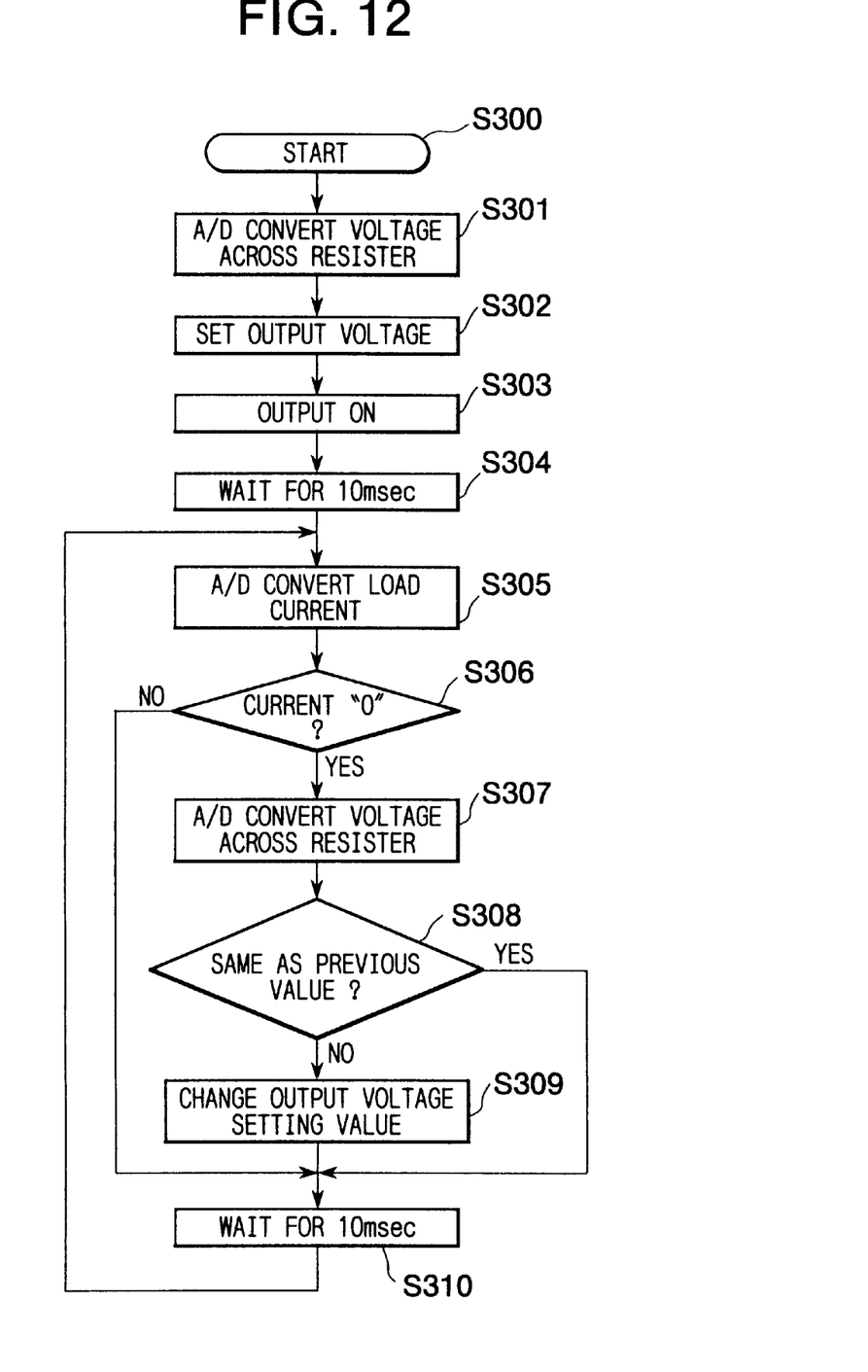
FIG. 12 is a flow chart illustrating a program for operating the DC power source unit of the third embodiment of the present invention.

As shown in FIG. 11, the main unit 11 of the DC power source unit includes a rectifying circuit 20, a switching circuit 22, a high frequency tansformer 43, and a high frequency rectifying circuit 44. The main unit 11 further includes an output voltage changeover circuit 45, a constant voltage control circuit 46 having an input connected to the output of the voltage changeover circuit 45, a photocoupler 47, and a switching control circuit 48 having an input connected to the constant voltage control circuit 46 through the photocoupler 47. The switching control circuit 48 produces a control signal in response to the signal output fed from the constant voltage control circuit 46 and transmitted through the photocoupler 47. The control signal is output to the switching circuit 22. The main unit 11 also includes a microcomputer 23. Although not shown in the drawing, the microcomputer 23 includes a central processing unit (CPU), a read-only memory (ROM), a random access memory (RAM), a timer, input ports, output ports, and A/D converters. The microcomputer 23 has an input port connected to a 5 volt power supply through a voltage dividing resistor 49b and another input port connected to one end of a load current detecting resistor 58 whose another end is connected to the output of the high frequency rectifying circuit 44.

The output voltage changeover circuit 45 includes a resistor network consisting of resistors 45b through 45e, and a transistor array 45f. The transistor array 45f connects one or more of the resistors 45a through 45e to ground in response to the output from the microcomputer 23.

An output voltage setting resistor 49a is provided in a connector 34 attached to one end of the output cable 12. The resistor 49a has a resistance value corresponding to a rated voltage of the tool. When the output cable 12 of the tool is connected to the main unit 11 through the connector 34, the output voltage setting resistor 49a is connected to both the microcomputer 23 and the resistor 49b.

Operation of the DC power supply unit thus constructed will be described while referring to the flowchart shown in FIG. 12.

When the plug 18 is inserted into the commercial AC 100 power supply socket, the microcomputer 23 starts executing the program (S300). Next, the microcomputer 23 detects a voltage at a connection between the resistors 49a and 49b. The voltage thus detected is subjected to an A/D conversion by means of the A/D converter contained in the microcomputer 23 (S301). The resultant digital signal is stored in the RAM as an output voltage instruction value Vcmd and is also applied to the transistor array 45f of the output voltage changeover circuit 45 (S302). In response to the signal fed from the microcomputer 23, the transistor array 45f selectively grounds one or more of the resistors 45b through 45e. According to the voltage division ratio determined by the resistors grounded, the output voltage changeover circuit 45 divides the voltage developed at the output of the high frequency rectifying circuit 44 and applies the resultant voltage to the constant voltage control circuit 46.

Next, the microcomputer 23 waits for 10 msec (S304) and then detects the output of the load current detecting resistor 58. The load current thus detected is subjected to an A/D conversion (S305). Thereafter, whether the load current is zero or not is determined (S3006). When the load current is not zero (S306: No), the routine proceeds to S310 where the microcomputer 23 waits for another 10 msec. Thereafter, the routine returns to S305.

When the determination made in S306 indicates that the load current is zero (S306: Yes), then the voltage at the connection of the resistors 49a and 49b is again detected and the detected voltage is subjected to an A/D conversion (S307). The resultant digital signal is compared with the output voltage instruction value Vcdm (S308). When the comparison result indicates that the two values are the same (S308: Yes), the routine proceeds to S310 where the microcomputer 23 fails for 10 msec, whereupn the routine returns to S305.

When the comparison made in S308 indicates that the later detected voltage is different from the earlier detected voltage, that is, the output voltage instruction value Vcmd (S308: No), the microcomputer 23 determines that a different electrically powered tool with a different rated voltage is connected to the main unit 11. In this case, the routine proceeds to S309 where the output voltage is set upon executing the same processes in S301 and S302.

With the above-described arrangement, a signal corresponding to the voltage developed across the output voltage setting resistor 49a is applied through the microcomputer 23 to the output voltage changeover circuit 45 when no load current is flowing into the tool. As a result, noise components are not superimposed on the signal derived from the resistor 49a and therefore a stable output voltage can be applied to the tool 40. The output voltage setting resistor 49a is provided in the connector 34 attached to one end of the output cable 12, so that a signal line for transmitting the signal derived from the output voltage setting resistor 49a does not need to be included in the output cable 12. The output cable 12 can thus be light in weight and manufactured at a low cost. On the other hand, in an arrangement of the type in which the output voltage setting resistor is provided in the adapter plug 13 that is attached to another end of the output cable 12, a signal line for transmitting the signal derived from the output voltage setting resistor needs to be additionally provided in the output cable 12.

While several exemplary embodiments of this invention have been described in detail, those skilled in the art will recognize that there are many possible modifications and variations which may be made in these exemplary embodiments while yet retaining many of the novel features and advantages of the invention. Accordingly, all such modifications and variations are intended to be included within the scope of the appended claims. For example, in the first embodiment, the FET 22a allows and interrupts the supply of current to the electrical drill 40 under the aegis of the microcomputer 23, other switching element, such as a relay, may be used in lieu of the FET 22a. Further, such switching element may be provided in the rectifying circuit 20.

The heat generating element 31a used in the second embodiment is not limited to the one shown in FIG. 10 but it can be any shape and any structure insofar as it exhibits a temperature characteristic similar to the electrically powered tool subjected to temperature monitoring.

In the first to third embodiments, the main unit 11 and the output cable 12 may be fixedly connected and the adapter plug 13 may be detachably connected to the output cable 12. When the third embodiment is modified in such a manner, a signal line for transmitting the signal on the output voltage setting resistor needs to be provided in the output cable 12.

In the third embodiment, the signal on the output voltage setting resistor 49a is transmitted to the output voltage changeover circuit 45 when the load current detected by the resistor 58 is zero. This can be modified to transmit the signal on the output voltage setting resistor 49a to the output voltage changeover circuit 45 when the motor is rotating with no load wherein a relatively low level current is flowing in the motor which may be 2 Amp to 5 Amp.

What is claimed is:

1. A DC power source unit for supplying DC voltage to an electrically powered tool, the DC power source unit comprising:

current detecting means for detecting a current flowing in the electrically powered tool and outputting a detection signal representative of a detected current;

control means for computing accumulated electrical quantity based on the detection signal received from said current detecting means, said control means predicting that the electrically powered tool is heated up to a first critical temperature based on the accumulated electrical quantity and outputting a prediction signal representative of the first critical temperature; and alarm means for indicating a temperature condition of the electrically powered tool.

2. The DC power source unit according to claim 1, wherein said alarm means indicates that the electrically powered tool is heated up to the first critical temperature in response to the prediction signal fed from said control means.

3. The DC power source unit according to claim 2, wherein said control means predicts that the electrically powered tool is heated up to the first critical temperature when the accumulated electrical quantity exceeded a first predetermined quantity.

4. The DC power source unit according to claim 3, wherein said current detecting means detects the current every predetermined interval and said control means computes the accumulated electrical quantity based further on the predetermined interval.

5. The DC power source unit according to claim 4, wherein said control means computes the accumulated electrical quantity every predetermined interval.

6. The DC power source unit according to claim 5, wherein the accumulated electrical quantity is computed by multiplying the current and the predetermined interval and thereafter subtracting a predetermined value.

7. The DC power source unit according to claim 6, wherein said control means stops supplying the current to the electrically powered tool when said control means predicts that the electrically powered tool is heated up to a second critical temperature higher than the first critical temperature.

8. The DC power source unit according to claim 7, wherein said control means predicts that the electrically powered tool is heated up to the second critical temperature when the accumulated electrical quantity exceeded a second predetermined quantity larger than the first predetermined quantity.

9. The DC power source unit according to claim 8, further comprising a reset switch for bringing the electrically powered tool to be operable when depressed, wherein when said control means predicts that the electrically powered tool is heated up to the second critical temperature, the electrically powered tool does not become operable until said rest switch is depressed.

10. The DC power source unit according to claim 8, wherein when said control means predicts that the electrically powered tool is heated up to the second critical temperature, said control means temporarily stops supplying the current to the electrically powered tool.

11. The DC power source unit according to claim 10, wherein when the current supplied to the electrically powered tool is temporarily stopped for a predetermined number of times within a predetermined period of time, said control means does not resume supplying the current to the electrically powered tool.

12. The DC power source unit according to claim 8, wherein said control means determines every predetermined interval whether or not the current detected by said current detecting means exceeds a predetermined level, and wherein said alarm means indicates that the electrically powered tool is heated up when the current exceeding the predetermined level flowed a predetermined number of times.

* * * * *